United States Patent [19]

Moriuchi et al.

[11] Patent Number: 5,686,325
[45] Date of Patent: Nov. 11, 1997

[54] METHOD FOR FORMING MESFET HAVING T-SHAPED GATE ELECTRODE

[75] Inventors: Toshiaki Moriuchi; Teruo Yokoyama, both of Kawasaki, Japan

[73] Assignee: Fujitsu Limited, Kawasaki, Japan

[21] Appl. No.: 531,981

[22] Filed: Sep. 21, 1995

[30] Foreign Application Priority Data

Nov. 30, 1994 [JP] Japan ............... 6-296960

[51] Int. Cl.6 ............................................. H01L 21/265
[52] U.S. Cl. ........................ 437/39; 437/41; 437/228; 437/912; 437/944; 148/DIG. 100
[58] Field of Search ................... 437/40 GS, 40 RG, 437/40 SH, 41 GS, 41 RG, 41 SH, 39, 228 O, 228 LO, 912, 944; 148/DIG. 100

[56] References Cited

U.S. PATENT DOCUMENTS

| | | | |
|---|---|---|---|
| 4,839,304 | 6/1989 | Morikawa | 437/39 |
| 4,843,024 | 6/1989 | Ito | 437/39 |
| 4,859,618 | 8/1989 | Shikata et al. | 437/41 |
| 4,978,629 | 12/1990 | Komori et al. | 437/41 |
| 5,445,977 | 8/1995 | Fujimoto | 437/912 |
| 5,484,740 | 1/1996 | Cho | 437/41 |
| 5,496,748 | 3/1996 | Hattori et al. | 437/39 |

FOREIGN PATENT DOCUMENTS

| | | | |
|---|---|---|---|
| 61-95573 | 5/1986 | Japan . | |
| 0052479 | 3/1988 | Japan | 437/41 |
| 64-20629 | 1/1989 | Japan . | |
| 0199473 | 8/1989 | Japan | 437/41 |
| 2-257618 | 10/1990 | Japan . | |
| 0312244 | 12/1990 | Japan | 437/40 |
| 4-282841 | 10/1992 | Japan . | |
| 404332136 | 11/1992 | Japan | 437/41 |
| 5-13462 | 1/1993 | Japan . | |
| 5-235056 | 9/1993 | Japan . | |

*Primary Examiner*—John Niebling
*Assistant Examiner*—Long Pham
*Attorney, Agent, or Firm*—Armstrong, Westerman, Hattori, McLeland & Naughton

[57] ABSTRACT

A compound semiconductor transistor has a structure in which a first insulating film is formed only under a overhang of a gate electrode an upper part of which is formed widely, and a second insulating film for threshold voltage adjustment is formed on the side of a gate electrode and the first insulating film.

17 Claims, 8 Drawing Sheets

METHOD FOR FORMING MESFET HAVING T-SHAPED GATE ELECTRODE

BACKGROUND OF THE INVENTION

1. Field of the Invention

The present invention relates to a semiconductor device and its production method, and more specifically, to a semiconductor device containing a compound semiconductor transistor having a gate electrode, such as a T-shaped gate electrode, provided with an overhang which widely expands at an upper side thereof, and its production method.

2. Description of the Prior Art

A field effect transistor using a compound semiconductor is widely used as a micro wave device because of its superior high frequency characteristics. Especially owing to prevalence of mobile phones and satellite broadcasting, it has become popular to incorporate a GaAsMESFET, a HEMT and the like comprising a compound semiconductor into an MMIC (monolithic microwave IC), wherein stabilization of a threshold voltage of a transistor and control accuracy of the threshold voltage are important.

As shown in FIG. 1, for example, the GaAsMESFET has an active semiconductor layer 102 containing some impurities which are formed over a semi-insulating compound semiconductor substrate 101, a gate electrode 103 which is formed on the active semiconductor layer 102, and a source electrode 106 and a drain electrode 107 which are formed on the active semiconductor layer 102 at each side of the gate electrode 103 through a contact layer 105. The gate electrode 103, the active semiconductor layer 102, the contact layer 105 and the like are covered with a protection layer 108 built using a material such as silicon oxide and silicon nitride.

In the field effect transistor mentioned above which uses a compound semiconductor substrate, the gate electrode 103 and the active semiconductor layer 102 are respectively stressed and tend to generate electric polarization in the compound semiconductor layer, whereby polarized charge is developed across a semiconductor crystal to cause a piezoelectric effect. If the polarized charge presents, a threshold of a gate voltage becomes instable.

The shorter the length of the gate electrode 103 in a channel length direction (that is, a gate length), the larger the variation of the threshold voltage according to the piezoelectric effect.

In order to stabilize the threshold voltage, uniformity of the quality of the protection film 108 which covers the gate electrode 103 and a stress control of the protection film 108 become necessary.

For example, Japanese Patent Laid-Open No. 95573/1986 describes that impurities are implanted into a gate electrode for controlling a stress from the gate electrode per se. Further, Japanese Patent Laid-Open No. 20629/1989 and Japanese Patent Laid-Open No. 247618/1990 describe that a stress from a gate electrode is canceled utilizing a stress from an insulating film which covers the gate electrode, by which the stress from the gate electrode can be controlled by changing a thickness of the insulating film. In addition, the stress from the gate electrode made only of tungsten silicide (WSi) can be controlled to some extent by changing sputtering conditions for WSi growth.

Still further, Japanese Patent Laid-Open No. 282841/1992 describes that a stress is adjusted by covering a semiconductor layer at a side of a gate electrode with an insulating film and then exposing the insulating film to oxygen plasma or nitrogen plasma.

In the patent specifications mentioned above, deviation of the threshold voltage caused by a piezoelectric effect is adjusted by covering a gate electrode having a square cross section which is formed by self-align techniques or lift-off techniques, however, these techniques described above can not be applied as they are to the gate electrode which has a simplified T-shaped cross section (hereinafter referred to as a T-shaped gate electrode).

In the T-shaped gate electrode, its narrow bottom surface forms a Schottky contact with a substrate layer. This bottom surface is made small as the gate length is decreased. On the other hand, the upper side of the T-shaped gate electrode widely expands to form an overhang-like extension to the lower side thereof for lowering the resistance, and a low resistance layer made of the other material is often stacked thereon.

In the T-shaped gate electrode which includes such an overhang as mentioned above, a stress cannot be stably controlled since the stresses applied to the upper and lower parts of the electrode are not uniform when a single insulating film is used, and as the result, controlling a threshold voltage becomes difficult.

SUMMARY OF THE INVENTION

It is an object of the present invention to provide a semiconductor device and its production method wherein variation of a threshold voltage caused by difference of stresses between a T-shaped gate electrode and a compound semiconductor layer is easily controlled.

According to the present invention, a first insulating film is selectively formed underneath an overhang of a gate electrode which is formed wider at the upper side, and side faces of the upper portion of the gate electrode, side faces of the first insulating film, and a surface of a compound semiconductor layer under the gate electrode are covered with a second insulating film for controlling the threshold voltage.

Therefore, the second insulating film equivalently covers the gate electrode having a square cross section, whereby stresses applied to a side area of the gate electrode are made uniform and controlling a threshold voltage is facilitated.

On the contrary, if the first insulating film forming area is largely extended from underneath the overhang of the gate electrode to both sides, then the stress from the second insulating film is not applied to the lower narrow area of the gate electrode, which makes controlling the threshold voltage difficult. On the other hand, if the first insulating film is completely removed and subsequently the gate electrode which has an upper wide area is covered only with the second insulating film, then a cavity is produced under the overhang of the gate electrode and the stress from the second insulating film is not applied to the lower narrow area of the gate electrode, which makes controlling the threshold voltage difficult. In addition, if the underneath of the overhang is filled with the second insulating film, then the stresses applied externally to the lower and upper parts of the T-shaped gate does not become uniform, accordingly, it is difficult to control the threshold voltage with the second insulating film.

Further, in accordance with the present invention, a single resist containing windows at a source region and a drain region is provided on the first insulating film. Using the resist as a mask, the first insulating film is left under the overhang of the gate electrode by isotropically etching the insulating film at both sides of the gate electrode to remove the insulating film in the source region and the drain region.

Then a source electrode and a drain electrode are made on a compound semiconductor layer using a lift-off method wherein the resist is used as a mask.

That is, as the resist is used not only as a mask for patterning the first insulating film but also as a mask for making a source electrode and a drain electrode, a mask-making process is simplified.

DESCRIPTION OF THE PREFERRED EMBODIMENTS

First Embodiment

FIGS. 2A to 2H are cross-sectional views illustrating a manufacturing process of a GaAsMESFET associated with a first embodiment of the present invention.

Figure 2A:
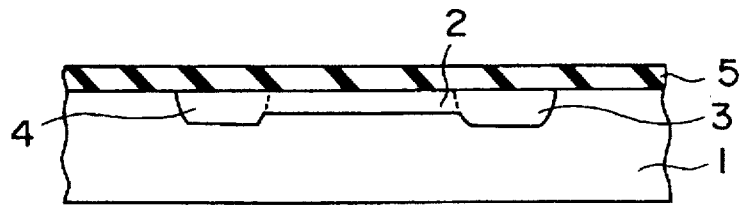
FIG. 2A to FIG. 2H are cross-sectional views illustrating a transistor manufacturing process associated with a first embodiment of the present invention.

Manufacturing process until the state shown in FIG. 2A is obtained is now described below.

First, silicon is ion-implanted to an element forming region in a semi-insulating compound semiconductor substrate 1 made of GaAs, then silicon is implanted again to each side of the element forming region. Subsequently, the impurity (silicon) is activated by annealing, and an n-type impurity diffused region 2 and $n^+$-type impurity diffused regions 3 and 4 on both sides thereof are formed. The n-type impurity diffused region 2 and the $n^+$-type impurity diffused regions 3 and 4 constitute an active semiconductor layer and the n-type impurity diffused region 2 serves as a channel region. Requirements for implanting silicon ion to form the n-type impurity diffused region 2 are to meet the acceleration energy of 60 keV and the dose amount of $4\times10^{} cm^{-2}$.

Then, using the plasma CVD technique, an insulating spacer layer 5 is formed on the compound semiconductor substrate 1 to a thickness of 300 nm.

Figure 2B:
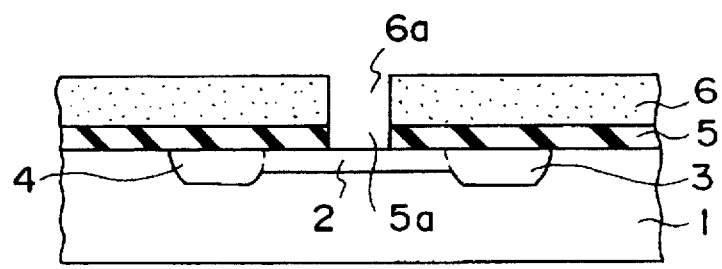

Next, as shown in FIG. 2B, resist 6 is applied over the spacer layer 5, exposed to light, and developed to form a first window 6a for a gate 6 which runs through the approximate center of the n-type impurity diffused region 2. The window 6a for a gate may be displaced not at the center of the n-type impurity diffused region 2 but to the source region to improve a drain dielectric strength.

Subsequently, using the resist 6 as a mask, the spacer layer 5 underneath the first window 6a for a gate is removed by reactive ion etching (RIE), whereby an opening 5a is formed underneath the first window 6a for a gate. The spacer layer 5 and the opening 5a serves as a mask which defines the shape of the lower part of a gate electrode described later.

Figure 2C:
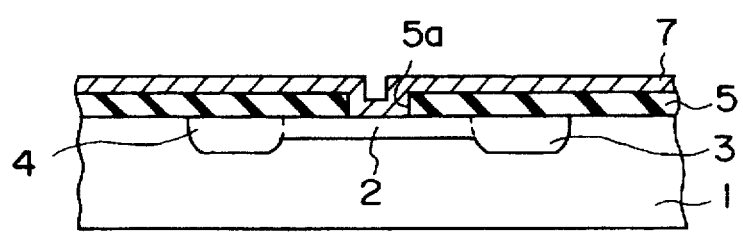
Figure 2D:
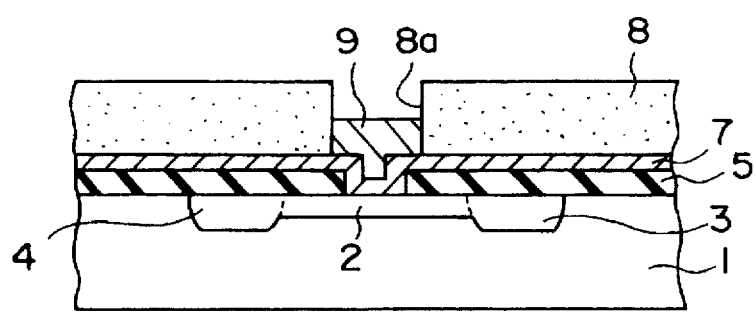

After removal of the resist 6, as shown is FIG. 2C, a film for example, a tungsten silicide (WSi) film 7, to be in Schottky-junction with the compound semiconductor substrate 1, is formed on the spacer layer 5 and on the inside of the opening 5a to a thickness of 100 nm by sputtering. In turn, as shown in FIG. 2D, a second resist 8 is applied on the WSi film 7, exposed to light, and developed to form a second window 8a for a gate, which is larger than the opening 5a, over the opening 5a.

Next, using the WSi film 7 as a plating electrode, gold is grown in the second window 8a for a gate to a thickness of 700 nm by electrolytic plating.

Figure 2E:
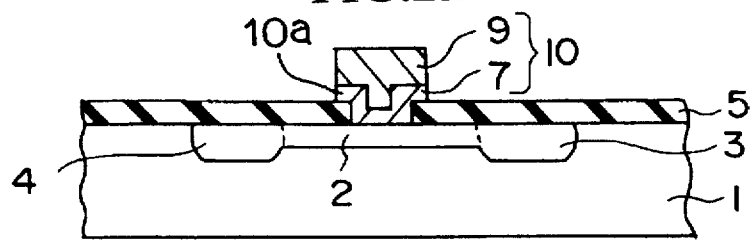
Figure 2F:
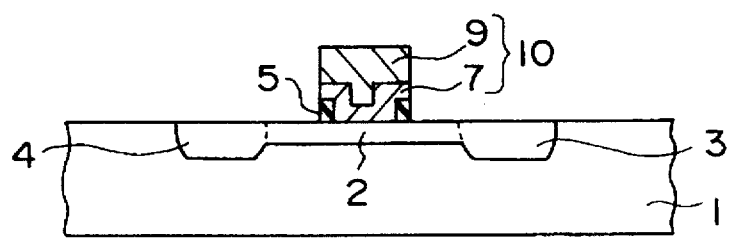

As a corresponding area of the WSi film 7 where a gold layer 9 is not covered is removed by reactive ion etching (RIE) after removal of the second resist 8, the WSi film 7 obtains a simplified T-shaped cross section over which the T-shaped gold layer 9 is provided as shown in FIG. 2E. The WSi film 7 and gold layer 9 together constitute a T-shaped gate electrode 10. Subsequently, as shown in FIG. 2F, a corresponding area of the spacer layer 5 which is not covered with a gold layer 9 is removed by reactive ion etching to allow to leave it only underneath an overhang 10a of the gate electrode. $SF_6$ is used as an etching gas for the spacer layer 5, and a mixed gas of $CF_4$ and $CHF_3$ is used as an etching gas for a spacer layer 5. Under the condition mentioned above, the T-shaped gate electrode 10 is hard to be decreased since the WSi film 7 is covered with the gold layer which is hard to react with the reactive etching such as the RIE.

Figure 2G:
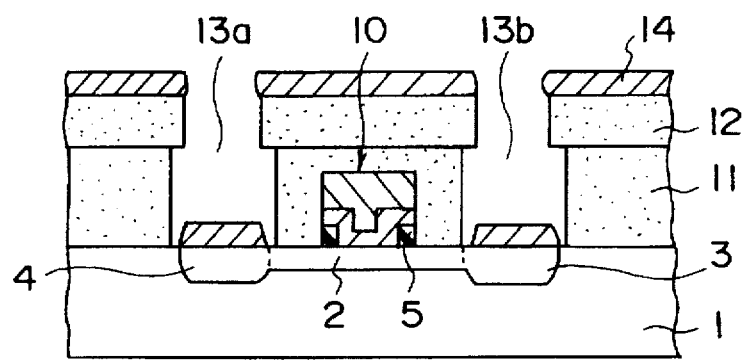

Next, the process to the state indicated by FIG. 2G is described.

High sensitive resist 11 and low sensitive resist 12 are applied onto the compound semiconductor substrate 1 in sequence. Then the high sensitive resist 11 on the $n^+$-type impurity diffused regions 3 and 4 is exposed to light with a low exposure amount. In turn, the low sensitive resist 12 is exposed to light with the exposed area being restricted narrower and the light exposure amount being increased. Next, the two-layer resist 11 and 12 is developed to form two windows 13a and 13b on the $n^+$-type impurity diffused region 3 and 4. In this case, as the low sensitive resist 12 is not exposed to light with a low exposure amount, each of cross sections of these windows 13a and 13b is respectively formed like an overhang with the low sensitive resist 12 expanding.

After that, a metal film 14 of two-layer structure composed of gold germanium alloy (AuGe) and gold (Au) is formed by sputtering. Then, when the two-layer resist 11 and 12 is removed, the metal layer 14 is left only over two regions of $n^+$ impurity diffused layer 3, 4, so that one of these regions is used as a source electrode 14s and the other is used as a drain electrode 14d. Owing to the overhang-shaped resist 11 and 12, the metal film 14 can be provided near exactly. AuGe which constitutes the metal layer 14 provides an ohmic contact to the compound semiconductor substrate made of GaAs.

Figure 2H:
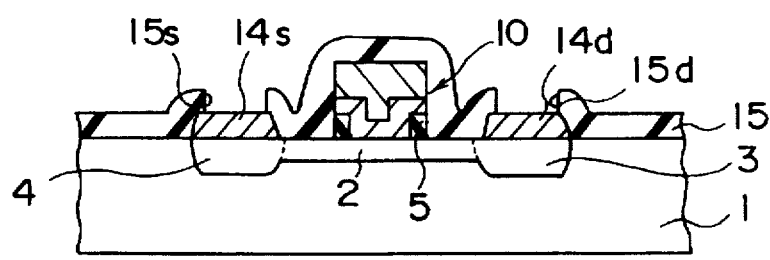

Characteristics of the transistor formed on the compound semiconductor substrate as mentioned above are estimated and a threshold voltage thereof is measured. Then, as shown in FIG. 2H, the transistor is covered with a threshold control insulating film 15 made of silicon nitride. At this time, based on relationship between a film thickness of the threshold control insulating film 15 and the threshold voltage or relationship between a film thickness of the threshold control insulating film 15 and a source-drain current which have been obtained previously, a threshold voltage is adjusted to a desired value depending on the thickness of the threshold control insulating film 15.

To the source electrode 14s and the drain electrode 14d, wiring is provided respectively through via holes 15s and 15d formed in a threshold control insulating film 15.

Figure 3:
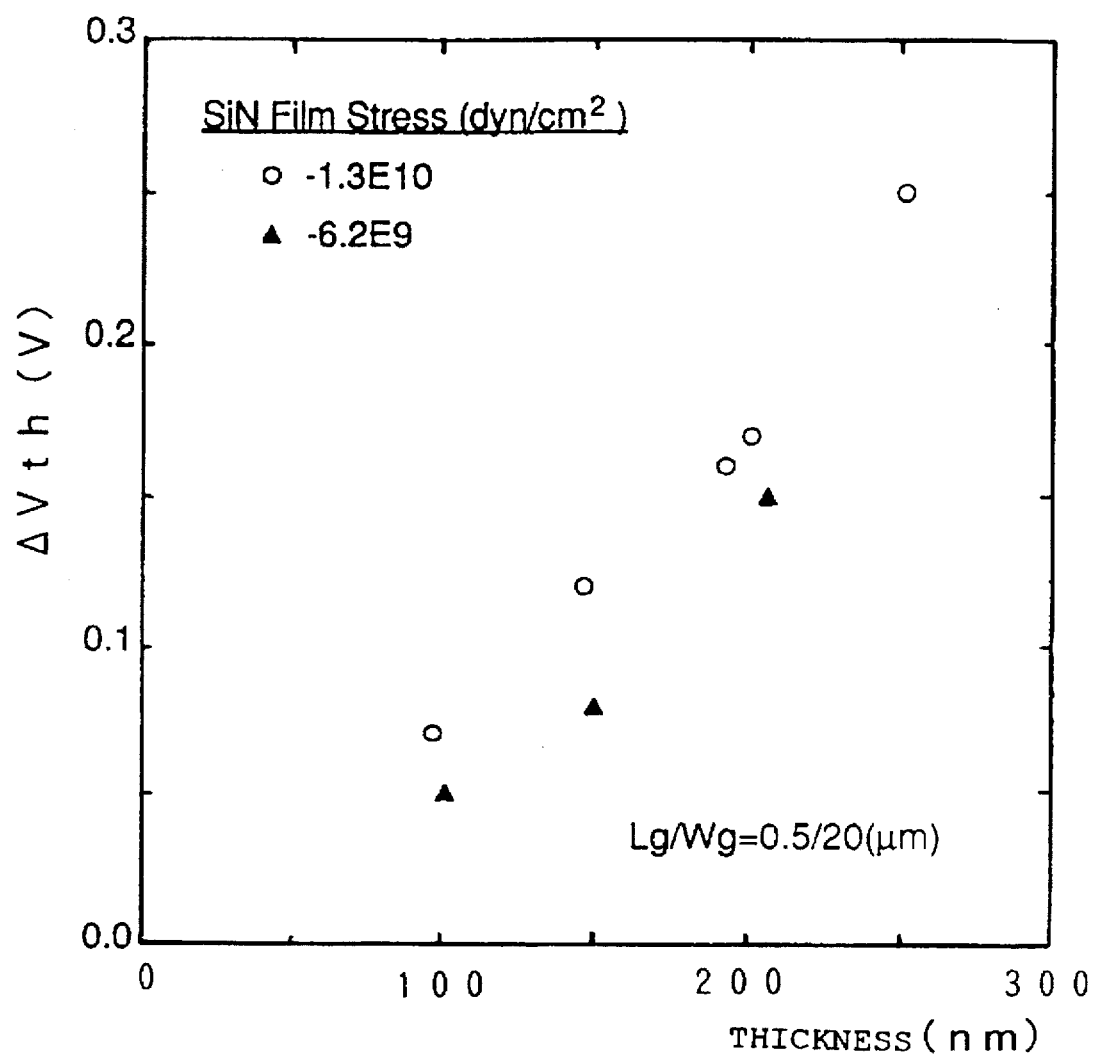
FIG. 3 is a characteristic drawing indicating relationship between a thickness of an insulating film for controlling a threshold and a shift amount of a threshold voltage, which is used for the first embodiment of the present invention.

Using as a parameter a stress of silicon nitride used for the threshold control insulating film 15, one example of relationship between a threshold voltage change amount $\Delta$Vth and a thickness of the threshold control insulating film 15 is shown in FIG. 3. In FIG. 3, a gate length $L_g$ indicates a length of a gate electrode in a channel length direction and a gate width $W_g$ indicates a length of a gate electrode in a direction perpendicular to the gate length. The stress per unit area of the threshold control insulating film 15 is approximately constant independent of a film thickness, however, as the film thickness is increased, the stress applied to the gate electrode 10 will rise.

When silicon nitride is used as a threshold control insulating film 15 and a gate length $L_g$ and a gate width $W_g$ are respectively 0.5 μm and 20 μm, in order to change the threshold voltage of a transistor to OFF side at least 0.1V by a stress of the threshold control insulating film 15, it is required that the product of the stress per unit area of the threshold control insulating film 15 and the film thickness thereof is $1 \times 10^5$ dyn/cm or more. For example, to shift a threshold voltage at least 0.1 V when a film thickness of silicon nitride is 160 nm, it is necessary to form nitride silicon provided with a stress per unit area of at least $-6.2 \times 10^9$ cyn/cm².

In the process mentioned above, as the spacer layer 5 made of $SiO_2$ is patterned using the gate electrode 10 as a mask, the spacer layer 5 under overhangs at both sides of the gate electrode 10 will not extend beyond the gate electrode 10. Accordingly, since the stress of the threshold control insulating film 15 is applied to the lower part of the gate electrode 10 without so attenuated by the spacer layer 5, controlling the stress of the threshold control insulating film 15 is so facilitated. In addition, as the threshold control insulating film 15 equivalently covers the gate electrode having a square cross section, the stress applied to the T-shaped gate electrode 10 is uniform and adjustment of the threshold voltage is facilitated.

Figure 4:
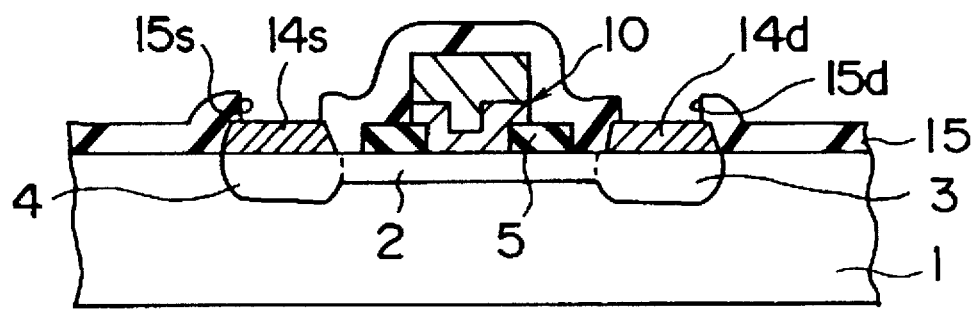
FIG. 4 is a cross-sectional view of an undesirable transistor wherein an insulating film is extended into the underneath of an overhang of a T-shaped gate electrode.
Figure 5:
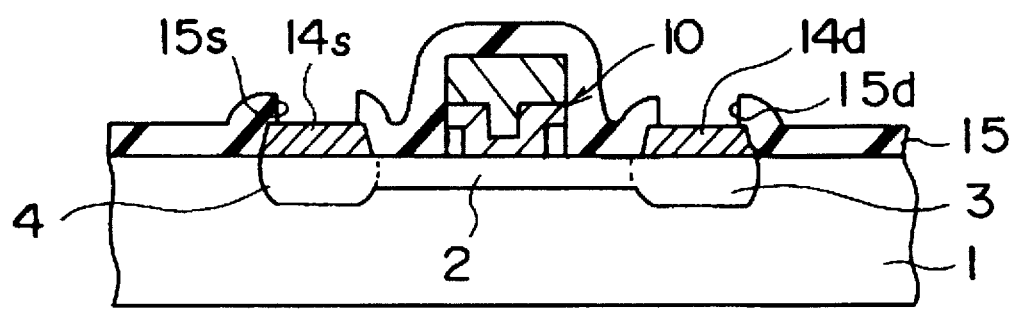
FIG. 5 is a cross sectional view of an undesirable transistor wherein an insulation layer under an overhang of a T-shaped gate electrode is removed.

On the contrary, as shown in FIG. 4, if the spacer layer 5 is largely extended from the underneath of an overhang of the gate electrode 10, then the stress of the spacer layer 5 becomes the dominant force as a stress applied to the lower part of the gate electrode 10 from the threshold control insulating film 15 and the adjustment of the threshold voltage using the stress of the threshold control insulating film 15 becomes difficult. That is, the stress of the threshold control insulating film 15 is not applied to the lower part of the gate electrode through the spacer layer 5. On the other hand, as shown in FIG. 5, if the spacer layer 5 is completely removed to form a cavity under an overhang of the gate electrode, then the threshold voltage adjustment becomes impossible because the stress from the threshold adjustment insulating 15 is not applied to the lower part of the gate electrode.

In addition, it may be conceived of changing the growth condition of the threshold control insulating film 15 to fill it under the overhang of the gate electrode 19 after removal of the complete spacer layer 5. In this case, however, it becomes difficult to equally apply stress from a single layer threshold control insulating film 15 to the upper and lower parts of the gate electrode 10.

Means for forming spacer layer 5 from a film which is different from the threshold control insulating film 15 in the stress determined by the entire stress of the gate electrode or a film which has opposite stress to that of the threshold control insulating film 15 may be employed, for example, a compressive stress in case of the threshold control insulating layer in a tensile stress. For example, $SiO_2$ (or SiON (silicon oxynitride)) is used as a spacer layer 5 and SiON (or $SiO_2$ film) is used as a threshold control insulating layer 15.

SiON operates to depress the stress Of the insulating film formed thereon.

Figure 1:
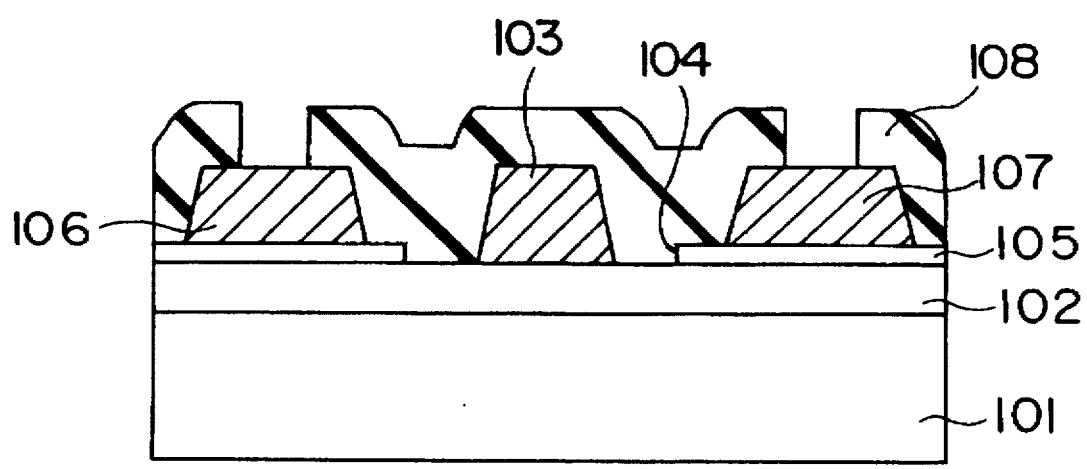
FIG. 1 is a cross-sectional view of a conventional transistor formed on a compound semiconductor layer by way of example.

For example, when silicon nitride is used as a protection film 108 of a MESFET shown in FIG. 1 and a SiON film is interposed between an active semiconductor layer 102 and the protection film 108, variation of the threshold voltage caused by the stress from the protection film 108 is decreased. From the experiments, it was found that the threshold voltage is shifted 0.15 V to the positive side by the protection film 108 of silicon nitride when a gate length is 0.8 μm and an SiON film is not provided over the active semiconductor layer 102, while the threshold voltage changes only 0.02V when an SiON film is interposed between the protection film 108 and the active semiconductor layer 102. It was also found that the threshold voltage shifts 0.09 V to the positive side when a gate length is 1.2 μm and a SiON film is not interposed between the protection film 108 and the active semiconductor layer 102, while the threshold voltage does not change with an SiON film interposed between the protection film 108 and the active semiconductor layer 102.

The spacer layer 5 may be composed of a SiN film or an SiON film and an $SiO_2$ film with compressive stress may be used as a threshold control insulating film 15 based on the threshold voltage amount, because a stress type of a WSi layer 7 composed of the gate electrode 10 is determined either tensile or compressive stress depending on the growth condition thereof, for example, gas pressure during spattering.

Second Embodiment

In a second embodiment, a multi-layer structure is employed for a spacer layer and resist is used as a mask for patterning the spacer layer.

FIGS. 6A to 6H are cross-sectional views illustrating a manufacturing process of a MESFET associated with the second embodiment of the present invention.

Figure 6A:
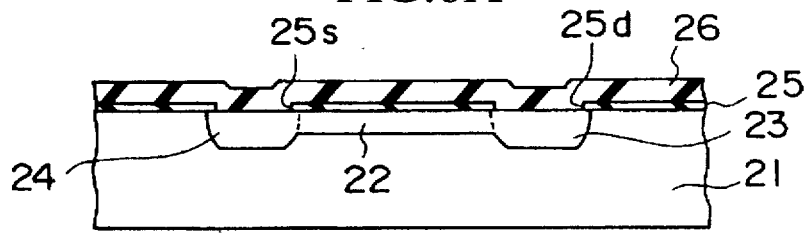
FIG. 6A to FIG. 6H are cross-sectional views illustrating a transistor manufacturing process associated with a second embodiment of the present invention.

First, manufacturing process until the cross section shown in FIG. 6A is obtained is described below.

An n-type impurity diffused region (active semiconductor region) 22 and n⁺-type impurity diffused region (contact regions) 23 and 24 are formed on a semi-insulating compound semiconductor substrate 21 made of GaAs according to the same method as the first embodiment. After a silicon nitride (SIN) film 25 is formed on the compound semiconductor substrate 21 to a thickness of 50 nm using CVD techniques, first and second openings 25s and 25d are formed on a source region and a drain region in the SiN film 25 using photo lithography techniques. As an etching gas for photo lithography process, $SF_6$ is used. Further, a spacer layer 26 made of silicon oxide ($SiO_2$) is formed on the inside of the first and second openings 25s and 25d and on the SiN film 25 using plasma CVD techniques.

Figure 6B:
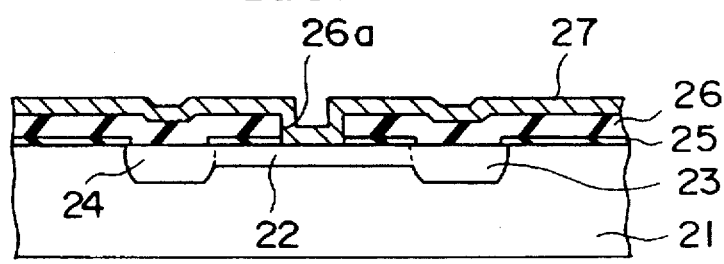

Next, as shown in FIG. 6B, with RIE techniques and photo lithography techniques using a resist mask, the SiN film 25 and the spacer layer 26 are patterned to form a third opening 26a which runs through a center of a surface of the n-type impurity diffusion region 22. Further a WSi film 27 is formed on the inside of the third opening 26a and on the spacer layer 26 to a thickness of 100 nm by sputtering.

Figure 6C:
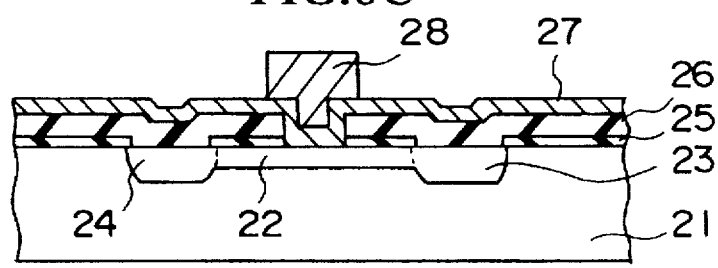

After that, as with the first embodiment, an Au film 28 which has a T-shaped cross section is formed within and around the third opening 26a using resist (not shown) and electrolytic plating techniques, as shown in FIG. 6C.

Figure 6D:
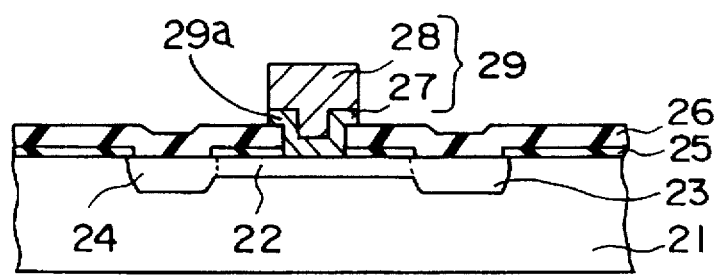

Then, after the resist (not shown) is removed, as with the first embodiment, the WSi film 27 in the area not covered with the Au film 28 is removed as shown in FIG. 6D. Thereby the WSi film 27 with a T-shaped cross section is obtained which serves as a gate electrode 29 together with the Au film 28.

Figure 6E:
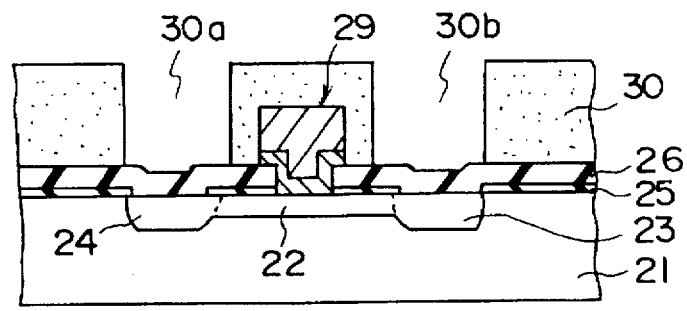

Next, after resist 30 is applied to the $SiO_2$ film 26 and the gate electrode 29, the resist 30 is exposed to light and developed to form windows 30a and 30b respectively at a source region and a drain region as shown in FIG. 6E.

Figure 6F:
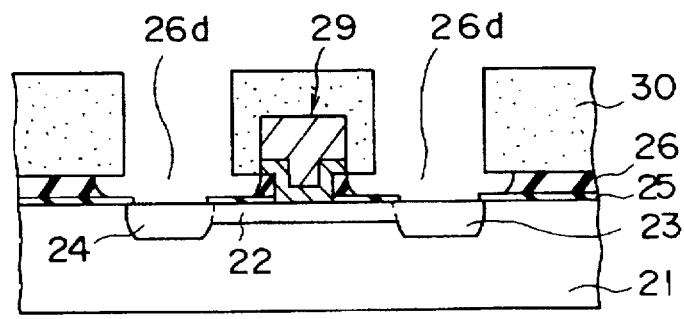

Subsequently, as shown in FIG. 6F, buffered hydrofluoric acid is used as an etchant and the $SiO_2$ film 26 exposed through the windows 30a and 30b is isotropically etched away by the buffered hydrofluoric acid while the $SiO_2$ film 26 under the resist 30 is etched away horizontally. In this case, a side etching amount is controlled by adjusting an etching time and a hydrofluoric acid concentration, leaving the $SiO_2$ film 26 under the overhang 29a of the T-shaped gate electrode 29 to the extent that the $SiO_2$ film 26 does not extend beyond the gate electrode, and the $n^+$-type impurity diffused regions 3 and 4 are exposed through the first and the second openings 25s and 25d. The $SiO_2$ film 26 is allowed to extend like a taper from the overhang 29a of the gate electrode 29 to a bottom of the $SiO_2$ film 26, and allowed to deviate from the edge of the overhang 29a within a margin of error about 200 nm. That is, it is required that a size of an upper surface of the $SiO_2$ film 26 and a size of the overhang of the gate electrode 29 are made uniform.

Figure 6G:
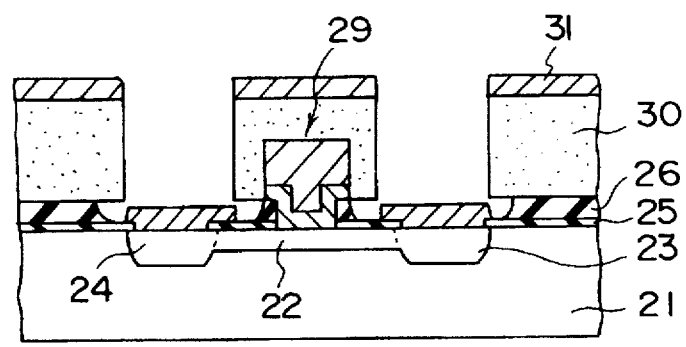

The the etching process uses hydrofluoric acid which serves to protect a surface of the compound semiconductor substrate 21 without practically etching the SiN film 25. Instead of the SiO film 25 and the $SiO_2$ film 26, SiON may be used respectively. The surface of the compound semiconductor substrate 21 is covered with a slowly etched insulating film and a spacer layer 26 thereon is formed with a rapidly etched insulating film. Subsequently, as shown in FIG. 6G, as a metal layer of a two-layer structure composed of AuGe and Au is successively formed by sputtering with leaving the resist 30, a metal layer 31 is formed over the $n^+$-type impurity diffused area 3 underneath the windows 30a and 30b of the resist 30 as well as over the resist 30. After that, the resist 30 is removed using a solvent to leave the metal layer 31 only over the $n^+$-type impurity diffused regions 3, 4, which are used respectively as a source electrode 31s and a drain electrode 31d.

Thus the windows 30a, 30b of the resist 30 extend to form an overhang in relation to the $SiO_2$ film 26 when the $SiO_2$ film is isotropically etched away using the resist 30 as a mask, the metal film 31 composing the source electrode 31s and the drain electrode 31d is surely cut on the edge of the windows 30a and 30b, so that the two layer resist as is used in the first embodiment becomes unnecessary, and the process is simplified because just one exposure operation is necessary.

Figure 6H:
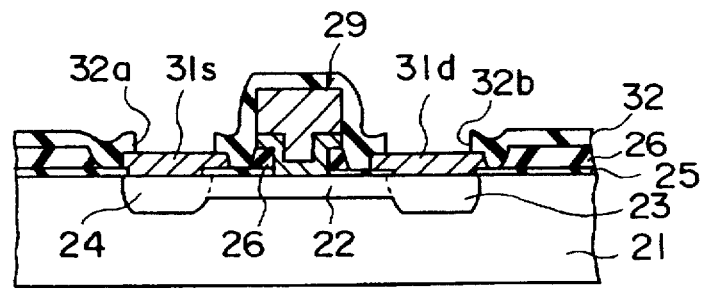

As a basic structure of a MESFET is obtained accordingly, its transistor characteristics and the threshold voltage are measured. Then, using a similar way to the first embodiment, an insulating threshold control insulating film 32, for example a film made of SiN, which has a certain stress in its entirety is formed (FIG. 6H). To the source electrode 31s and the drain electrode 31d, wiring is provided respectively through via holes 32a, 32b formed in a threshold control insulating film 32.

The stress from the threshold control insulating film 32 is controlled by the materials, growth condition and film thickness thereof. For example, when a SiN film of $5\times10^9$ $dyn/cm^2$ was formed as a threshold control insulating film 32 using plasma CVD techniques, in a MESFET containing a gate electrode 29 with a gate length of 0.5 μm a gate width of 20 μm, a source-drain current changes 10 mA/mm to the negative side when a drain-source voltage Vds of 3V is applied.

In this embodiment, also the spacer layer 26 is left underneath the overhang of the both sides of the gate electrode 29 with scarcely extending beyond the gate electrode, so that controlling stress at the lower part of the gate electrode 29 using a threshold control insulating film 32 is facilitated. The reason why a thin SiN film 26 is used for a lower layer of the spacer layer 26 is to adjust the threshold voltage by applying a tensile stress onto the surface of the active semiconductor layer and to form source and gate electrodes with good reproductivity since SiN is scarcely removed during etching the spacer layer $SiO_2$.

Other Embodiments

Figure 7:
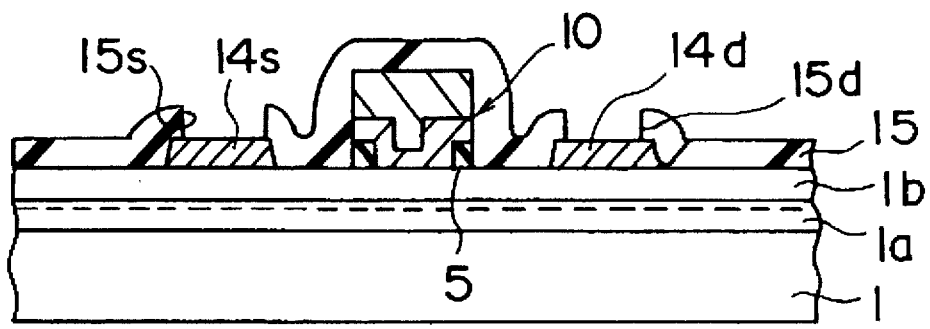
FIG. 7 and FIG. 8 are cross-sectional views respectively associated with the other embodiments of the present invention.
Figure 8:
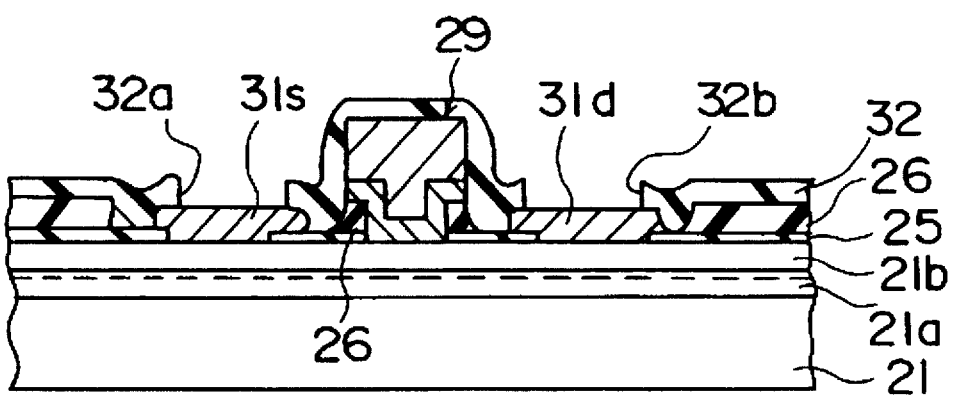

These embodiments mentioned above are explained on a MESFET giving some examples, however, as shown in FIG. 7 and FIG. 8, electron transit layers 1a and 21a made of undoped GaAs are formed on compound semiconductor substrates 1 and 21, on top of which electron supply layers 1b and 21b made of n-type AlGaAs are formed, on top of which further gate electrodes 10 and 29, source electrodes 15s, 31s, and drain electrodes 15d, 31d are formed through the process described above. In the FIG. 7 and FIG. 8, respective broken lines represent two-dimensional electron gas.

Materials for the above-mentioned compound semiconductor substrate, gate electrode, source electrode, drain electrode, spacer layer, and threshold control insulating film are not restricted to the materials mentioned above. As the material of a compound semiconductor substrate, a binary or ternary semiconductor, for example, a binary semiconductor such as GaAs or InP, a ternary semiconductor such as InGaAs or AlGaAs, may be used. As for a gate electrode, WN, TiN, TiWN, WSiN, WAl, Al, Ti, Pt, Ni, Pd, W, or Mo may be used as well as WSi as a material with which a Schotkky barrier is formed on a junction surface with the compound semiconductor layer, and AuGe/Ni or AuSn may be used as well as AuGe as the material for providing an ohmic contact on a contact surface with the compound semiconductor layer.

In the embodiments mentioned above, a T-shaped gate electrode is described, which is also called as a Y-shaped or mushroom gate, however, what is important is that those gate electrodes having a overhang extending beyond a Schottky-junction portion can obtain the similar effect.

The stress of the insulating film under the overhang of the gate electrode and the stress of the electrode mentioned above is preferably close, and optimally same.

What is claimed is:

1. A method for forming semiconductor device comprising the steps of:

forming a first insulating film on a compound semiconductor layer served as a channel;

forming an opening at a gate electrode forming region in said first insulating film;

depositing a first conductive film in said opening and on said first insulating film, said first conductive film forming a Shotkky barrier on a junction surface with said compound semiconductor layer;

patterning said first conductive film to leave said first conductive film within and around said opening for forming a gate electrode which has an overhang out of said opening;

patterning said first insulating film to leave said first insulating film selectively under said overhang at a side of said gate electrode;

forming a source electrode and a drain electrode respectively onto areas to be a source region and a drain region of said compound semiconductor layer; and forming a second insulating film contacting to a side surface of said first insulating film, a surface of said gate electrode and a surface of said compound semiconductor layer.

2. The method for forming semiconductor device according to claim 1, wherein said gate electrode is used as a mask for patterning said first insulating film.

3. The method for forming semiconductor device according to claim 1, wherein said gate electrode patterned by using a metal pattern as mask, said metal pattern formed on said first conductive film by plating locally.

4. The method for forming semiconductor device according to claim 1, further comprising a step of forming a third insulating film on said compound semiconductor layer, said third insulating film having openings at said source region and said drain region.

5. The method for forming semiconductor device according to claim 1, wherein said first insulating film has a smaller internal stress than an internal stress in said second insulating film.

6. The method for forming semiconductor device according to claim 5, wherein said first insulating film is made of $SiO_2$ or SiON.

7. The method for forming semiconductor device according to claim 1, wherein said compound semiconductor layer is made of either GaAs, AlGaAs, or InGaAs.

8. The method for forming semiconductor device according to claim 1, wherein said gate electrode is made of any one of WSi, WN, TiN, TiWN, WSiN, WAl, Al, Ti, Pt, Ni, Pd, W, and Mo.

9. A method for forming semiconductor device comprising the steps of:

forming a first insulating film on a compound semiconductor layer served as a channel;

forming an opening at a gate electrode forming region in said first insulating film;

depositing a first conductive film in said opening and on said first insulating film, said first conductive film forming a Shotkky barrier on a junction surface with said compound semiconductor layer;

patterning said first conductive film to leave said first conductive film within and around said opening for forming a gate electrode which has an overhang out of said opening;

forming a resist film on said first insulating film and said gate electrode, said resist having windows respectively at a source region and a drain region in said compound semiconductor layer;

removing said first insulating film within a first area between said gate electrode and said source region and a second area between said gate electrode and said drain region without removing a part of said first insulating film under said overhang through said windows of said resist film by isotropical etching;

forming a second conductive film on said compound semiconductor layer as a source electrode and a drain electrode though said windows at said source region and said drain region, and forming said second conductive film on said resist film;

lifting off said second conductive film without removing said second conductive film over said source region and said drain region by removing said resist film; and forming a second insulating film contacting to a side surface of said first insulating film, a surface of said gate electrode and a surface of said compound semiconductor layer.

10. The method for forming semiconductor device according to claim 9, wherein said gate electrode patterned by using a metal pattern as mask, said metal pattern formed on said first conductive film by plating locally.

11. The method for forming semiconductor device according to claim 9 further comprising a step of forming a third insulating film on said compound semiconductor layer, said third insulating film having openings at said source region and said drain region.

12. The method for forming semiconductor device according to claim 9, wherein said first insulating film has a smaller internal stress than an internal stress in said second insulating film.

13. The method for forming semiconductor device according to claim 12, wherein said first insulating film is made of $SiO_2$ or SiON.

14. The method for forming semiconductor device according to claim 9, wherein said compound semiconductor layer is made of either GaAs, AlGaAs, or InGaAs.

15. The method for forming semiconductor device according to claim 9, wherein said gate electrode is made of any one of WSi, WN TiN, TiWN, WSiN, WAl, Al, Ti, Pt, Ni, Pd, W, and Mo.

16. The method for forming semiconductor device according to claim 5, wherein said second insulating film is made of SiNx or SiON.

17. The method for forming semiconductor device according to claim 12, wherein said second insulating film is made of SiNx or SiON.

* * * * *